(12) United States Patent
Nobehara et al.

(10) Patent No.: US 10,950,277 B1
(45) Date of Patent: Mar. 16, 2021

(54) SIGNAL LINE LAYOUTS INCLUDING SHIELDS, AND RELATED METHODS, DEVICES, AND SYSTEMS

(71) Applicant: Micron Technology, Inc., Boise, ID (US)

(72) Inventors: Wataru Nobehara, Tokyo (JP); Takamitsu Onda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/656,907

(22) Filed: Oct. 18, 2019

(51) Int. Cl.
*G11C 5/00* (2006.01)
*G11C 5/06* (2006.01)
*G11C 5/02* (2006.01)

(52) U.S. Cl.
CPC .............. *G11C 5/005* (2013.01); *G11C 5/025* (2013.01); *G11C 5/063* (2013.01)

(58) Field of Classification Search
CPC .......... G11C 5/005; G11C 5/025; G11C 5/063
See application file for complete search history.

(56) References Cited

U.S. PATENT DOCUMENTS

| | | | |
|---|---|---|---|
| 5,808,930 A * | 9/1998 | Wada | G11C 5/14 365/51 |
| 6,285,573 B1 | 9/2001 | Park | |
| 7,739,624 B2 * | 6/2010 | McElvain | G06F 30/394 716/101 |
| 8,166,443 B2 * | 4/2012 | Aoki | H01L 23/5225 716/129 |
| 8,686,567 B2 * | 4/2014 | Endo | H01L 23/5286 257/691 |
| 9,754,872 B1 * | 9/2017 | Sato | H01L 23/5226 |
| 10,262,935 B2 * | 4/2019 | Kim | H01L 23/5225 |
| 10,304,771 B2 * | 5/2019 | Sato | H01L 23/481 |

* cited by examiner

*Primary Examiner* — Vanthu T Nguyen
(74) *Attorney, Agent, or Firm* — TraskBritt

(57) ABSTRACT

An integrated circuit including a signal line layout is disclosed. A signal line layout may include a number of signal lines configured for conveying a number of signals. The signal line layout may further include a number of shield lines. Each signal line of the number of signal lines may be positioned adjacent a first shield line and a second shield line of the number of the shield lines. Further, first shield line may extend a length of an adjacent signal line and the second shield line may extend less than a length of the adjacent signal line. An electronic system including circuitry having one or more signal line layouts, and methods of forming signal line layout are also described.

21 Claims, 11 Drawing Sheets

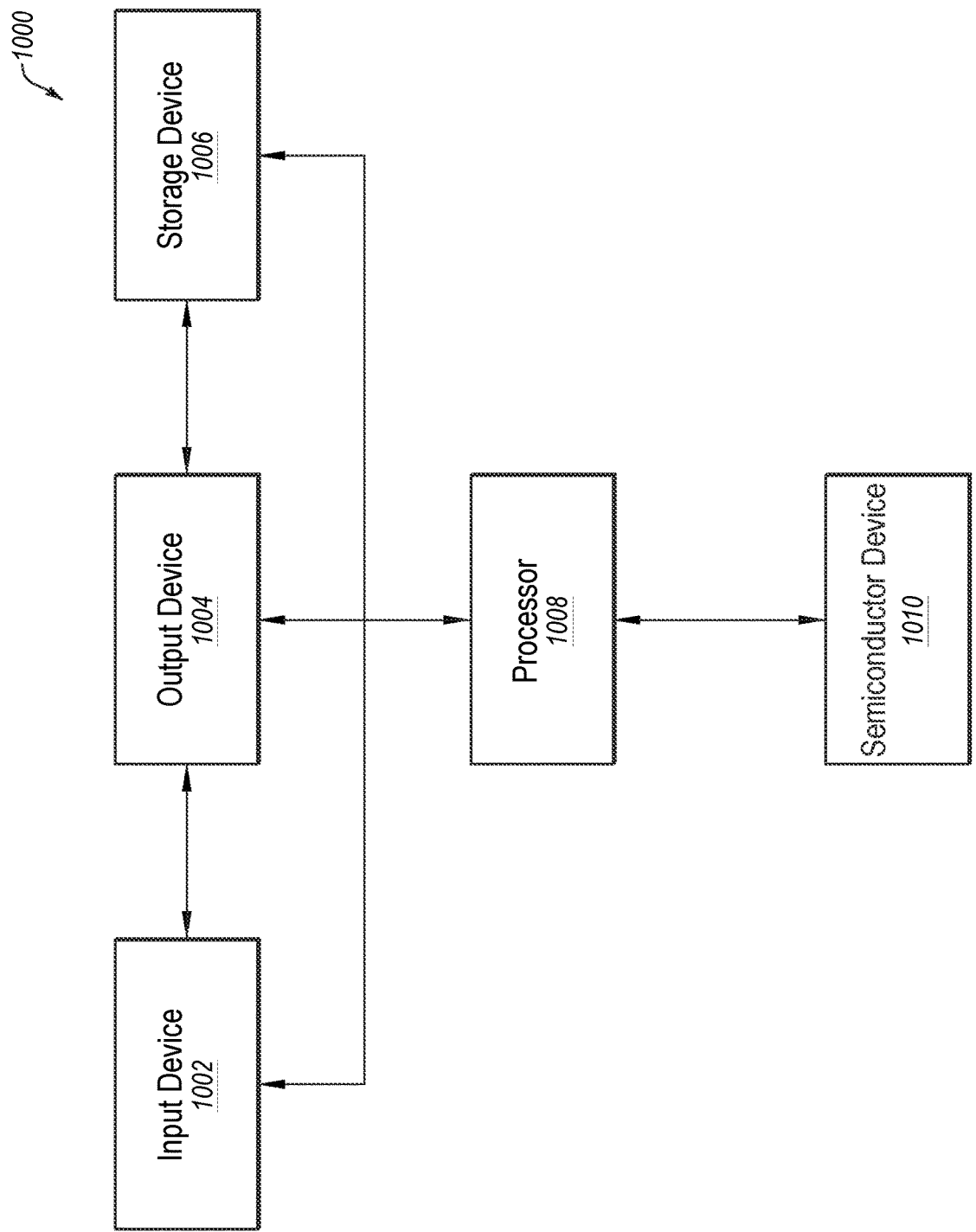

SIGNAL LINE LAYOUTS INCLUDING SHIELDS, AND RELATED METHODS, DEVICES, AND SYSTEMS

TECHNICAL FIELD

Embodiments of the disclosure relate to integrated circuits. More specifically, various embodiments relate to integrated circuit signal line layouts including shields, and to related methods, devices, and systems.

BACKGROUND

Integrated circuits (ICs) are continuously being made smaller as demand for portability, computing power, memory capacity, and energy efficiency in modern electronics grows. Therefore, the size of IC constituent features, such as electrical devices and interconnect line widths, is also decreasing continuously.

The trend of decreasing feature size is evident in memory circuits or devices such as dynamic random access memory ("DRAM"), flash memory, nonvolatile memory, static random access memory ("SRAM"), ferroelectric ("FE") memory, logic gate arrays and so forth. For example, DRAM typically comprises millions of identical circuit elements, known as memory cells. In general, a memory cell typically includes two electrical devices: a storage capacitor and an access field effect transistor. Each memory cell is an addressable location that can store one binary digit ("bit") of data. A bit can be written to a cell through the transistor and read by sensing charge on the storage electrode from the reference electrode side. By decreasing the sizes of constituent electrical devices and the conductive lines that access them, the sizes of the memory devices incorporating these features can be decreased.

However, the decreasing size of ICs and the spacing between conductive lines of ICs may lead to increased interference between conductive lines and decreased signal integrity. Accordingly, a trade-off exists between size and performance of ICs.

BRIEF DESCRIPTION OF THE DRAWINGS

FIG. 10 is a simplified block diagram of an example electronic system, in accordance with various embodiments of the present disclosure.

DETAILED DESCRIPTION

Various embodiments described herein relate to various signal line layouts (also referred to herein as "signal line configurations" or simply "configurations" or "layouts"). According to various embodiments, an integrated circuit (IC) may include a signal line layout including a number of signal lines (also referred to herein as "conductive lines" or simply "conductors") and a number of shield lines (also referred to herein as "shields"), wherein each signal line of the number of signal lines is positioned between a first shield line and a second shield line of the number of the shield lines. More specifically, in some embodiments, a first side of a signal line may positioned adjacent a first shield line, and a second, opposite side of the signal line may be positioned adjacent a second shield line. Further, in some embodiments, the first shield line may extend at least a length of the signal line, and the second shield line may extend less than a length of the signal line.

As a non-limiting example, a memory device may include one or more signal line layouts (e.g., as part of and/or coupled to a memory array), in accordance with various embodiments of the present disclosure. Although various embodiments are described herein with reference to memory device ICs, the present disclosure is not so limited, and the embodiments may be applicable non-memory ICs.

Figure 1:
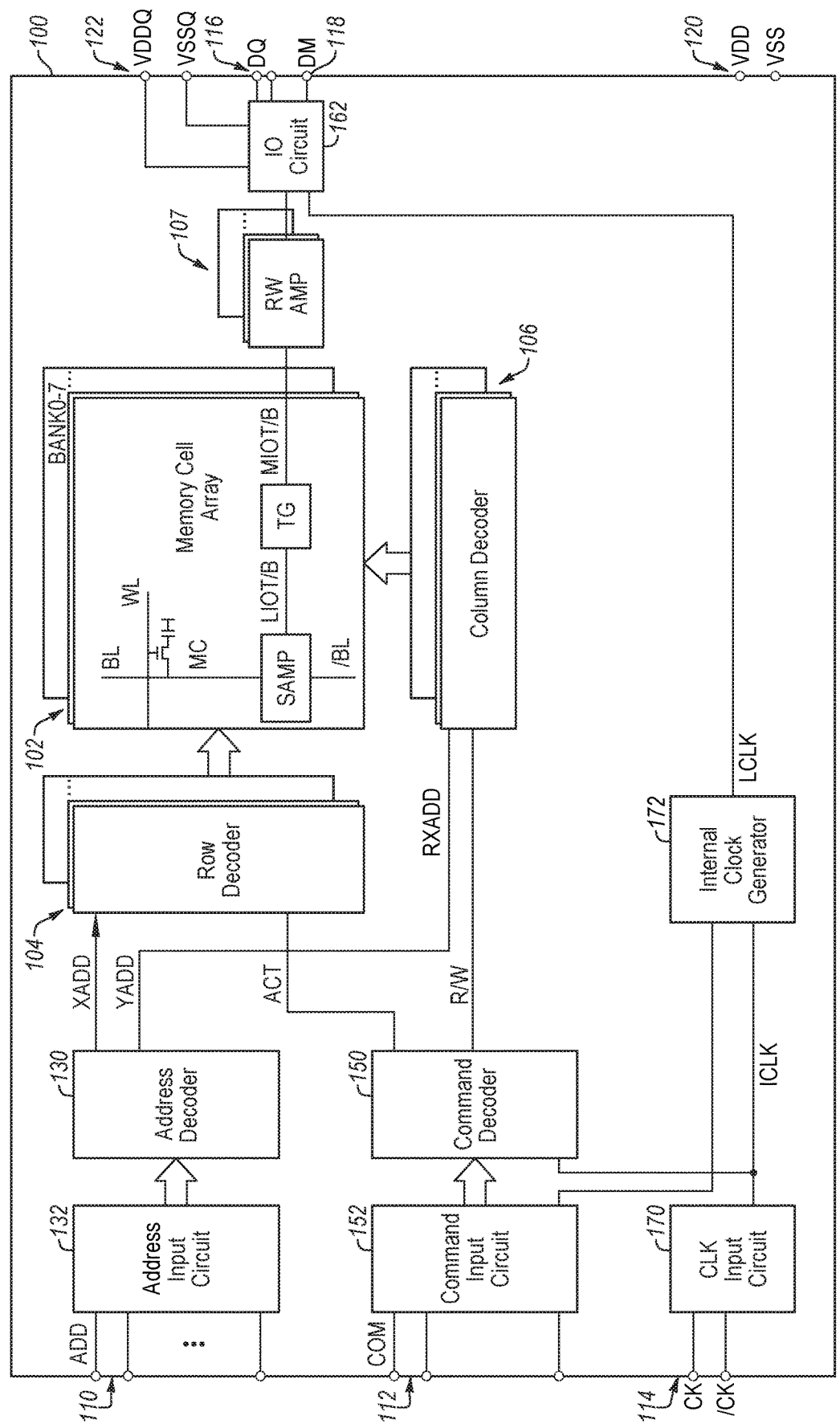
FIG. 1 is a block diagram of an example memory device, according to various embodiments of the present disclosure.

FIG. 1 includes a block diagram of an example memory device 100, according to various embodiments of the present disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG.1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

For example, memory device 100 may include one or more signal line layouts, as described more fully below. More specifically, for example, data may be read from and/or written to memory cell array 102 via one or more signal line layouts including a number of signal lines and a number of shields. In these embodiments, memory cell array 102, input/output circuit 162, read/write amplifier 107, transfer gate TG, and/or sense amplifier SAMP, may include one or more signal line layouts, in accordance with various embodiments described more fully below. Yet more specifically, for example, one or more signal line layouts, as described herein, may include main input/output (MIO) lines and/or local input/output (LIO) lines of memory device 100.

Clock signals CK and /CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 2A:
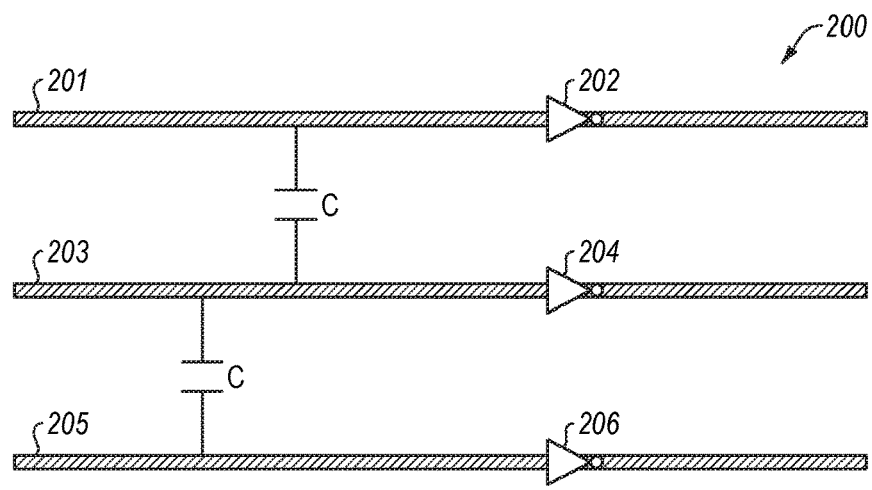
FIGS. 2A-2E illustrate a number of signal line configurations.

FIG. 2A depicts a signal line configuration (also referred to herein as a "signal line layout") 200 including a number or signal lines 201, 203, and 205. Signal line 201 includes an inverter 202, signal line 203 includes an inverter 204, and signal line 205 includes an inverter 206. As will be appreciated by a person having ordinary skill, a parasitic capacitance C may exist between signal line 201 and signal line 203 and between signal line 203 and signal line 205. Therefore, some crosstalk between signal line 201 and signal line 203 and/or between signal line 203 and signal line 205 may occur. However, in this example, because the signals lines are sufficiently spaced from one another, any crosstalk may be negligible and may be ignored.

Figure 2B:
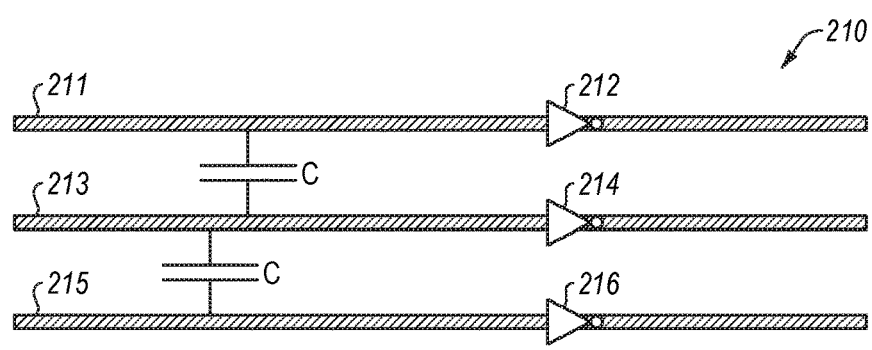

However, if spacing between signal lines of a signal line configuration is reduced, parasitic capacitance between the signal lines may increase, and thus crosstalk may increase. FIG. 2B depicts a signal line configuration 210 including a number or signal lines 211, 213, and 215. Signal line 211 includes an inverter 212, signal line 213 includes an inverter 214, and signal line 215 includes an inverter 216. As will be appreciated by a person having ordinary skill, parasitic capacitance C may exist between signal line 211 and signal line 213 and/or between signal line 213 and signal line 215. In contrast to signal line configuration 200 shown in FIG. 2A, the signal lines of signal line configuration 210 are closer together, and thus, in signal line configuration 210, the crosstalk caused by parasitic capacitance C may reduce signal integrity, increase signal delay, and/or cause an associated device (e.g., a memory device) to malfunction. More specifically, for example, a state of an output of inverter 214 of signal line 213 may undesirably change (e.g., from LOW to HIGH, or vice versa) due to crosstalk between signal line 211 and signal line 213 and/or crosstalk between signal line 213 and signal line 215.

Figure 2C:
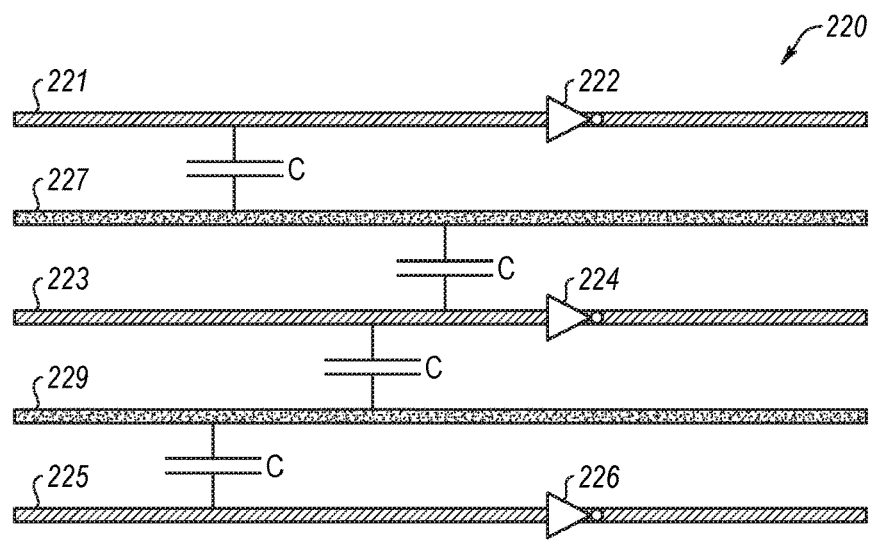

FIG. 2C illustrates another signal line configuration 220 including a number or signal lines 221, 223, and 225. Signal line 221 includes an inverter 222, signal line 223 includes an inverter 224, and signal line 225 includes an inverter 226. Further, signal line configuration 220 includes a shield 227 positioned between signal lines 221 and 223, and a shield 229 positioned between signal lines 223 and 225. In this configuration, although shields 227 and 229 may limit and possibly prevent crosstalk between signal lines 221, 223, and 225, shields 227 and 229 may increase a size of a device including signal line configuration 220.

Figure 2D:
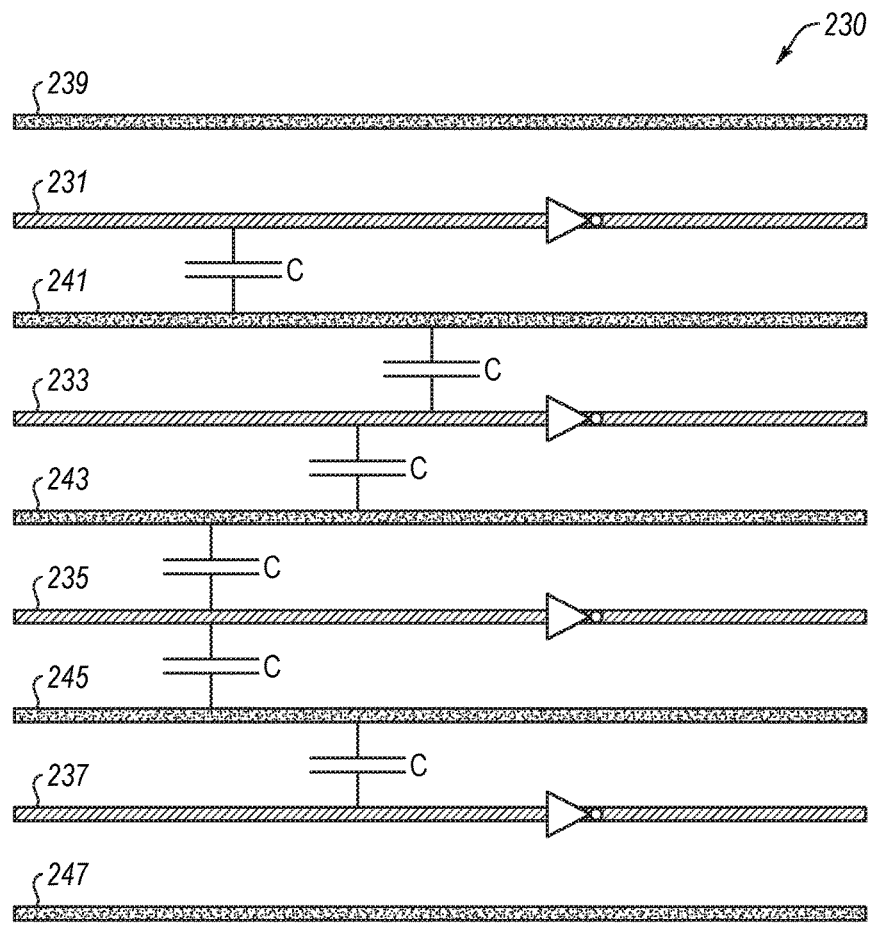

FIG. 2D depicts another signal configuration 230 including a number of signal lines (i.e., N signal lines) and a number of shields (i.e., N+1 shields). More specifically, signal configuration 230 includes signal lines 231, 233, 235, and 237, and shields 239, 241, 243, 245, and 247. Each signal line of signal configuration 230 is positioned between two (2) shields. Accordingly, signal configuration 230 has a 100% shield rate (i.e., one side of each signal line is positioned adjacent a shield, and another side of each signal line is positioned adjacent another shield). In other words, a first side of a signal line is fully shielded, and a second side of the signal line is fully shielded (i.e., 0.5*100%+ 0.5*100%=100% shield rate). Although a 100% shield rate may sufficiently reduce crosstalk, fully shielding each side of a signal line increases the size of an associated device.

Figure 2E:
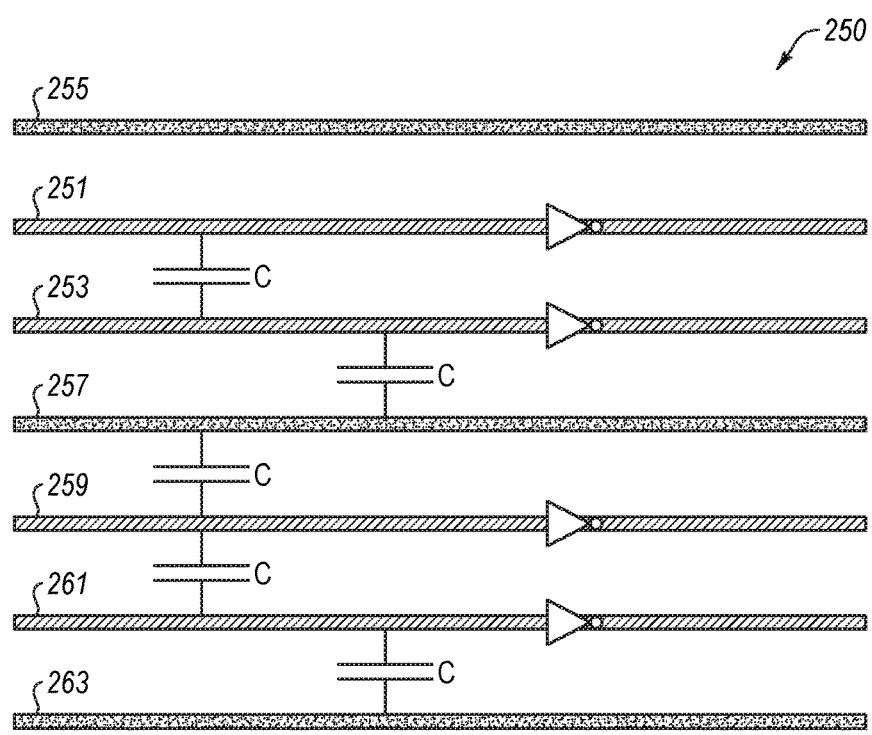

Further, FIG. 2E depicts yet another signal line configuration 250 wherein every two (2) signal lines are surrounded by shields. More specifically, signal line configuration 250 includes signal lines 251, 253, 259, and 261, and shields 255, 257, and 263. As illustrated, signal lines 251 and 253 are positioned between shields 255 and 257, and signal lines 259 and 261 are positioned between shields 257 and 263. Accordingly, signal configuration 250 has a 50% shield rate (i.e., one side of each signal line is positioned adjacent a shield, and another side of each signal line is positioned adjacent another signal line). In other words, a first side of a signal line is fully shielded, and a second side of the signal line not even partially shielded (i.e., 0.5*100%+ 0.5*0%=50% shield rate). A 50% shield rate may not sufficiently reduce crosstalk.

Various embodiments of the present disclosure relate to a various signal line layouts that may provide sufficient shielding effect (e.g., sufficient shield rates) while minimizing device size (e.g., IC size). For example, various embodiments may include and/or relate to signal line layouts wherein one side of each signal line of a layout is shielded (e.g., partially or fully shielded) from another signal line of the layout, and another side of each signal line of the layout is shielded (e.g., partially or fully shielded) from another signal line of the layout. In addition to shield rates between 50% and 100%, various embodiments may allow for any desired shield rate between 50% and 100%, or a shield rates less than 50%, if desired.

Figure 3:
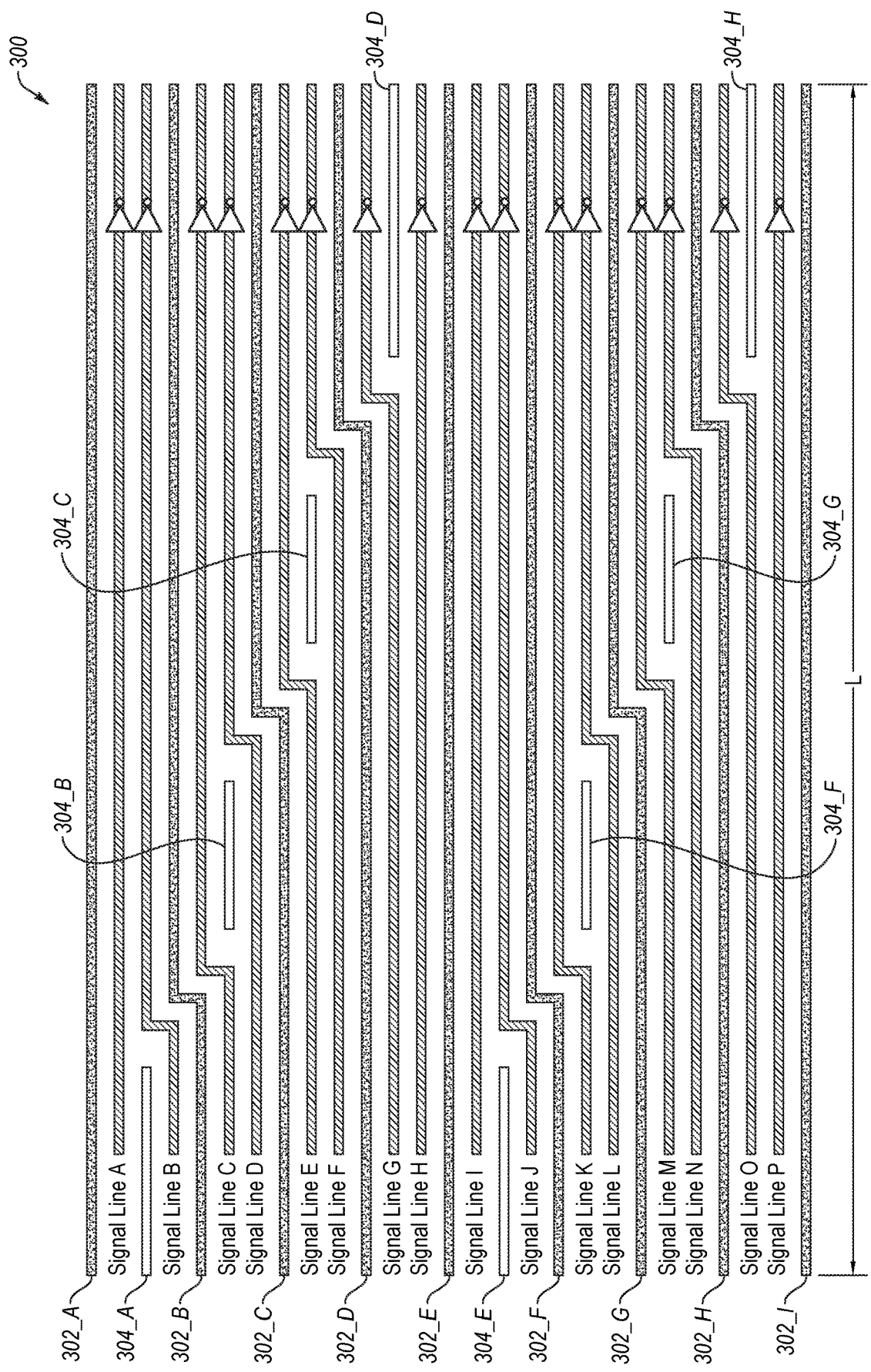
FIG. 3 illustrates an example signal line layout, in accordance with various embodiments of the present disclosure.

FIG. 3 illustrates an example signal line layout 300, in accordance with various embodiments of the present disclosure. In some embodiments, signal line layout 300 may be part of an integrated circuit. Signal line layout (also referred to herein as "signal line configuration" or simply "configuration" or "layout") 300 includes a number a signal lines A-P for conveying a number of signals (e.g., to/from a memory array). Signal line layout 300 further includes a number of shields 302_A-302_I, and a number of shields 304_A-304_H. Each of shields 302_A-302_I may also be referred to herein as a "full shield," and shields 304_A-304_H may also be referred to herein as a "partial shield." Shields 302_A-302_I and shields 304_A-304_H may include any suitable material for reducing crosstalk between associated signal lines, such as a conductive material, an insulative material, or any other suitable material. Further, according to some embodiments, one or more of shields 302_A-302_I and/or one or more of shields 304_A-304_H may be coupled to a reference voltage, such as a ground voltage or another voltage (e.g., a fixed voltage). Although not necessary, each signal line in signal line layout 300 includes an inverter.

Signal line layout 300 has a length L. According to various embodiments, shields 302_A-302_I may have a length substantially equal to length L, and shields 304_A-304_H may have a length that is less than length L. Further, in some embodiments, a length of each signal line A-P may be greater than a length of shields 304_A-304_H, and less than or substantially equal to length L. It is noted that, depending on the configuration, the signal lines and shields of signal line layout 300 may be vertically spaced or horizontally spaced. For example, in some embodiments, the signal lines and shields of signal line layout 300 may be vertically spaced such that, for example, shield 302_A may be formed above signal line A, and signal line A may be formed above shield 304_A and signal line B. In other words, each signal line and shield may be formed on a different horizontal plane. In other embodiments, the signal lines and shields of signal line layout 300 may be horizontally spaced such that the signal lines and shields are formed on the same horizontal plan. Other configurations are also contemplated, such as a configuration wherein a number of shields and/or signal lines are formed on one horizontal plane, and a number of shields and/or signal lines are formed on another horizontal plane.

As illustrated in FIG. 3, a shield 302 is positioned on one side of a signal line, and a partial shield 304 is positioned on another side of the signal line. More specifically, for example, shield 302_A is positioned on a first side of signal line A, and a partial shield 304_A is positioned on a second (e.g., opposite) side of signal line A. As illustrated, shield 302_A extends at least a length of adjacent signal line A, and partial shield 304_A extends less than a length of adjacent signal line A.

Further, in this example, partial shield 304_A is positioned between a portion of signal line A and portion of signal line B. However, in this embodiment, because partial shield 304_A only partially shields (e.g., isolates) signal line A from signal line B (e.g., 25% shield effect), and vice versa, at least a portion of signal line A is unshielded from at least a portion of signal line B. Stated another way, a portion of signal line A is positioned adjacent a portion of signal line B and thus a portion of signal line A is not isolated from a portion of signal line B via a shield. Thus, in this embodiment, signal line A and signal line B are only partially shielded (e.g., 25% shielded) from one another.

As another example, shield 302_B is positioned on a first side of signal line C, and a partial shield 304_B is positioned on a second (e.g., opposite) side of signal line C. As illustrated, shield 302_B extends at least a length of adjacent signal line B, and partial shield 304_B extends less than a length of signal line C. Further, in this example, partial shield 304_B is offset (e.g., horizontally in FIG. 3) from partial shield 304_A and is positioned between signal line C and signal line D.

Further, as another example, shield 302_C is positioned on a first side of signal line E, and a partial shield 304_C is positioned on a second (e.g., opposite) side of signal line E. As illustrated, shield 302_C extends at least a length of adjacent signal line E, and partial shield 304_C extends less than a length of signal line E. Further, in this example, partial shield 304_C is offset (e.g., horizontally in FIG. 3) from partial shield 304_B and is positioned between signal line E and signal line F.

As yet another example, shield 302_D is positioned on a first side of signal line G, and a partial shield 304_D is positioned on a second (e.g., opposite) side of signal line G. As illustrated, shield 302_D extends at least a length of adjacent signal line G, and partial shield 304_D extends less than a length of signal line G. In this example, partial shield 304_D is offset (e.g., horizontally in FIG. 3) from partial shield 304_C and is positioned between signal line G and signal line H.

For example, signal line layout 300 has a 62.5% shield rate. In other words, a first side of each signal line is fully shielded, and a second side of each signal line is 25% shielded (i.e., 0.5*100%+0.5*25%=62.5% shield rate). Further, in the illustrated embodiment, signal line layout 300 includes sixteen (16) signal lines, nine (9) full shields, and eight (8) partial shields, wherein each partial shield is 25% of a full shield. Thus, in this example, signal line layout 300 may include an equivalent of eleven (11) full shields (i.e., 9+8(0.25)=11). Thus, in contrast to signal line configuration 250 of FIG. 2E, which would include nine (9) full shields for sixteen (16) signal lines, signal configuration 300 has a 62.5% shield rate, wherein signal line configuration 250 has a 50% shield rate.

Figure 4:
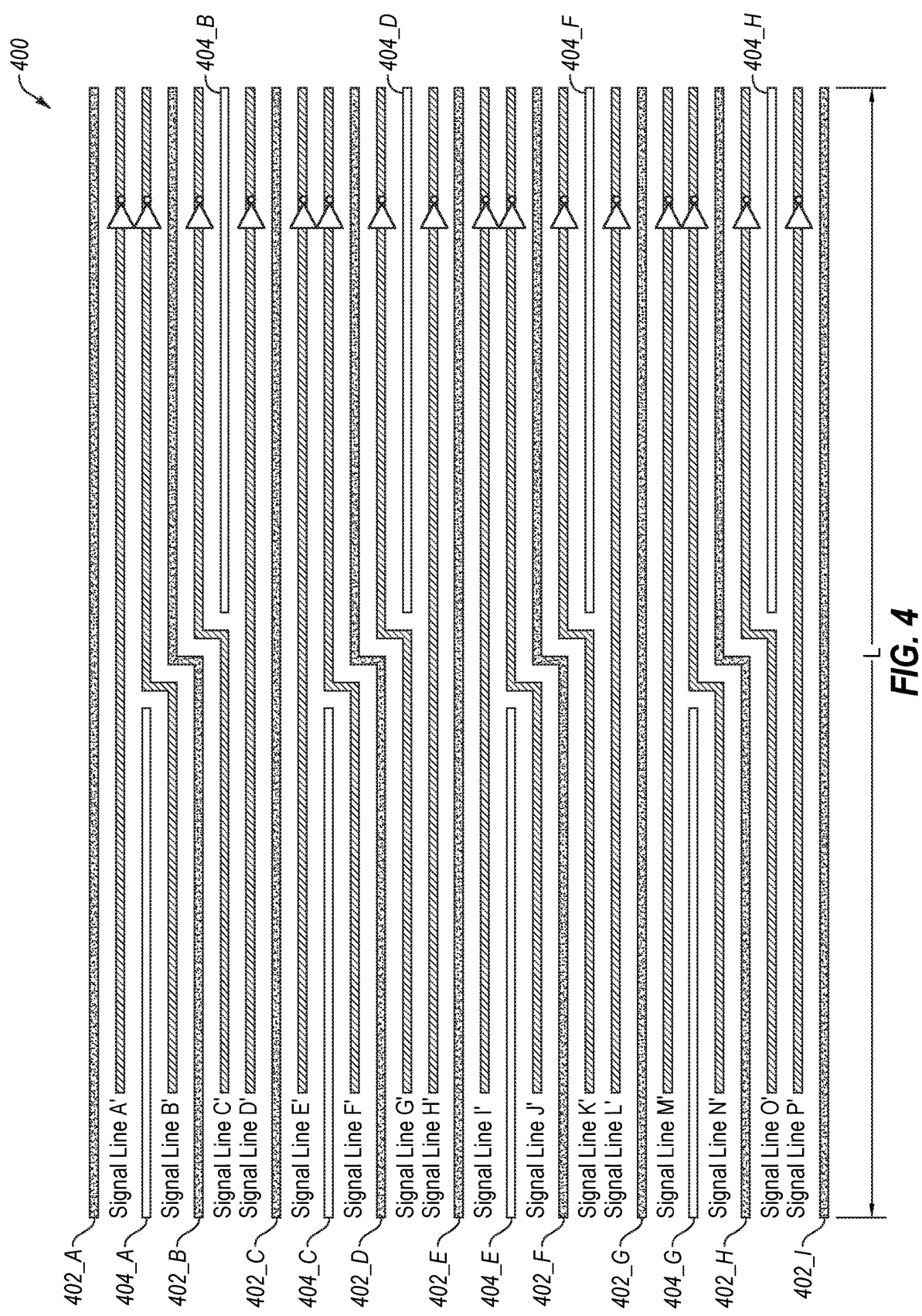
FIG. 4 illustrates another example signal line layout, in accordance with various embodiments of the present disclosure.

FIG. 4 illustrates an example signal line layout 400, in accordance with various embodiments of the present disclosure. In some embodiments, signal line layout 400 may be part of an integrated circuit. Signal line layout (also referred to herein as "signal line configuration" or simply "configuration" or "layout") 400 includes a number a signal lines A'-P' for conveying a number of signals (e.g., to/from a memory array). Signal line layout 400 further includes a number of shields 402_A-402_I, and a number of shields 404_A-404_H. Each of shields 402_A-402_I may also be referred to herein as a "full shield," and each of shields 404_A-404_H may also be referred to herein as a "partial shield." Shields 402_A-402_I and shields 404_A-404_H may include any suitable material for reducing crosstalk between associated signal lines, such as a conductive material, an insulative material, or any other suitable material. According to some embodiments, one or more of shields 402_A-402_I and/or one or more of shields 404_A-404_H may be coupled to a reference voltage, such as a ground voltage or another voltage. Although not necessary, each signal line in signal line layout 400 includes an inverter.

Signal line layout 400 has length L. According to various embodiments, shields 402_A-402_I may have a length substantially equal to length L, and shields 404_A-404_H may have a length that is less than length L. Further, in some embodiments, a length of each signal line A'-P' may be greater than a length of shields 404_A-404_H, and less than or substantially equal to length L. It is noted that, depending on the configuration, the signal lines and shields of signal line layout 400 may be vertically spaced or horizontally spaced. For example, in some embodiments, the signal lines and shields of signal line layout 400 may be vertically spaced such that, for example, shield 402_A may be formed above signal line A', and signal line A' may be formed above shield 404_A and signal line B'. In other words, each signal line and shield may be formed on a different horizontal plane. In other embodiments, the signal lines and shields of signal line layout 400 may be horizontally spaced such that the signal lines and shields are formed on the same horizontal plan. Other configurations are also contemplated, such as a configuration wherein a number of shields and/or signal lines are formed on one horizontal plane, and a number of shields and/or signal lines are formed on another horizontal plane.

As illustrated in FIG. 4, a shield 402 is positioned on one side of a signal line, and a partial shield 404 is positioned on another side of the signal line. More specifically, for example, shield 402_A is positioned on a first side of signal line A', and a partial shield 404_A is positioned on a second (e.g., opposite) side of signal line A'. As illustrated, shield 402_A extends at least a length of adjacent signal line A', and partial shield 404_A extends less than a length of adjacent signal line A'.

Further, in this example, partial shield 404_A is positioned between signal line A' and signal line B'. However, in this embodiment, because partial shield 404_A only partially shields signal line A' from signal line B', and vice versa, at least a portion of signal line A' is unshielded from at least a portion of signal line B'. Stated another way, a portion of signal line A' is positioned adjacent a portion of signal line B' and thus a portion of signal line A' is not isolated from a portion of signal line B' via a shield. Thus, in this embodiment, signal line A' and signal line B' are only partially shielded (e.g., 50% shielded) from one another.

As another example, shield 402_B is positioned on a first side of signal line C', and a partial shield 404_B is positioned on a second (e.g., opposite) side of signal line C'. As illustrated, shield 402_B extends at least a length of adjacent signal line C', and partial shield 404_B extends less than a length of signal line C'. Further, in this example, partial shield 404_B is offset (e.g., horizontally in FIG. 4) from partial shield 404_A and is positioned between signal line C' and signal line D'.

Further, as another example, shield 402_C is positioned on a first side of signal line E', and a partial shield 404_C is positioned on a second (e.g., opposite) side of signal line E'. As illustrated, shield 402_C extends at least a length of adjacent signal line E', and partial shield 404_C extends less than a length of signal line E'. Further, in this example, partial shield 404_C is offset (e.g., horizontally in FIG. 4) from partial shield 404_B and is positioned between signal line E' and signal line F'.

As yet another example, shield 402_D is positioned on a first side of signal line G', and a partial shield 404_D is positioned on a second (e.g., opposite) side of signal line G'. As illustrated, shield 402_D extends at least a length of adjacent signal line G', and partial shield 404_D extends less than a length of signal line G'. In this example, partial shield 404_D is offset (e.g., horizontally in FIG. 4) from partial shield 404_C and is positioned between signal line G' and signal line H'.

For example, signal line layout 400 has a 75% shield rate. In other words, a first side of each signal line is fully shielded (i.e., 100% shielded), and a second side of each signal line is 50% shielded (i.e., 0.5*100%+0.5*50%=75% shield rate). Further, in the illustrated embodiment, signal line layout 400 includes sixteen (16) signal lines, nine (9) full shields, and eight (8) partial shields, wherein each partial shield is 50% of a full shield. Thus, in this example, signal line layout 400 may include an equivalent of thirteen (13) full shields (i.e., 9+8(0.50)=13).

Figure 5:
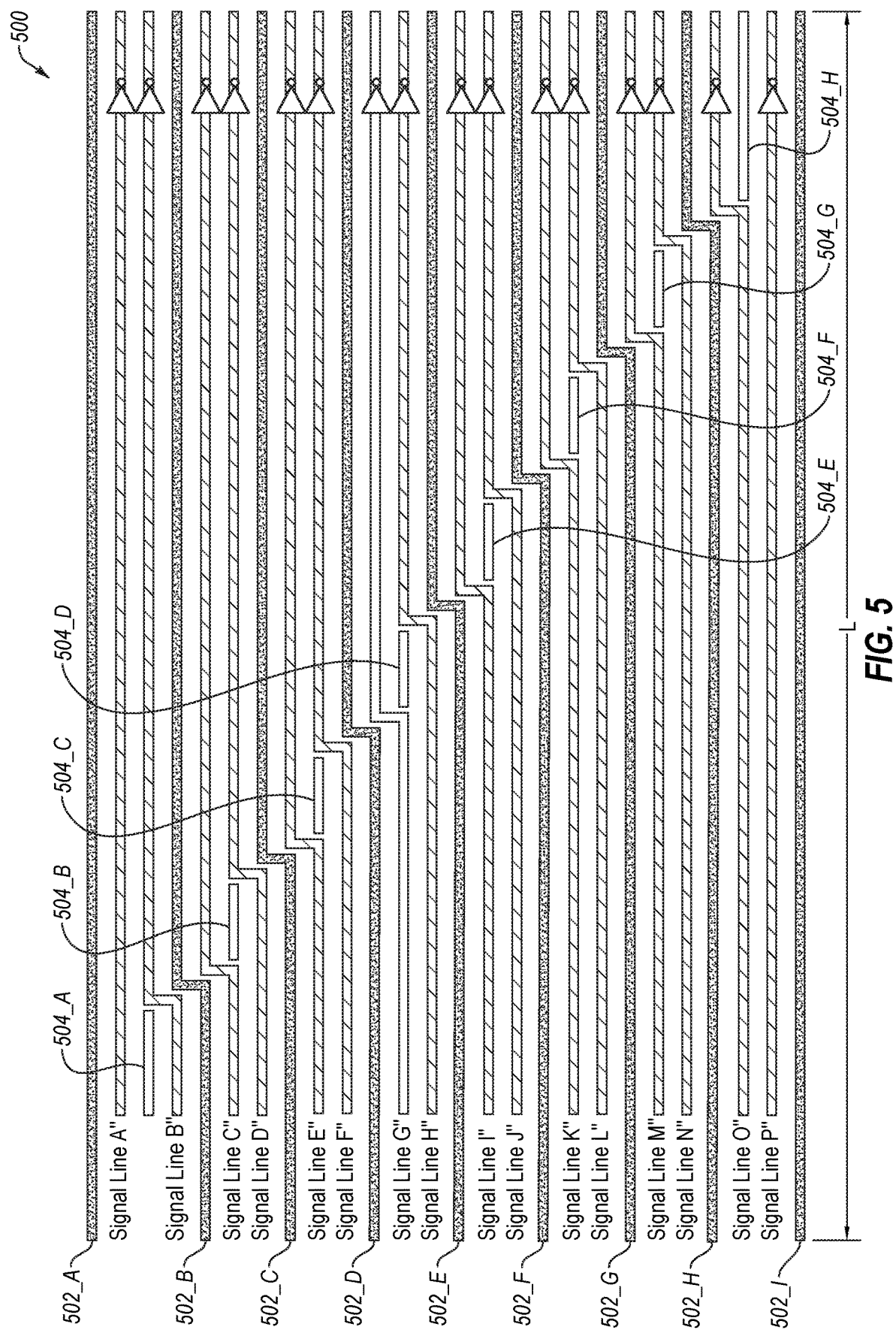
FIG. 5 illustrates yet another example signal line layout, in accordance with various embodiments of the present disclosure.

FIG. 5 illustrates yet another example signal line layout 500, in accordance with various embodiments of the present disclosure. In some embodiments, signal line layout 500 may be part of an integrated circuit. Signal line configuration (also referred to herein as "signal line configuration" or simply "configuration" or "layout") 500 includes a number a signal lines A"-P" for conveying a number of signals (e.g., to/from a memory array). Signal line layout 500 further includes a number of shields 502_A-502_I, and a number of shields 504_A-504_H. Each of shields 502_A-502_I may also be referred to herein as a "full shield," and each of shields 504_A-504_H may also be referred to herein as a "partial shield." Shields 502_A-502_I and shields 504_A-504 H may include any suitable material for reducing crosstalk between associated signal lines, such as a conductive material, an insulative material, or any other suitable material. According to some embodiments, one or more of shields 502_A-502_I and/or one or more of shields 504_A-504_H may be coupled to a reference voltage, such as a ground voltage or another voltage. Although not necessary, each signal line in signal line layout 500 includes an inverter.

Signal line layout 500 has length L. According to various embodiments, shields 502_A-502_I may have a length substantially equal to length L, and shields 504_A-504_H may have a length that is less than length L. Further, in some embodiments, a length of each signal line A"-P" may be greater than a length of shields 504_A-504_H, and less than or substantially equal to length L. It is noted that, depending on the configuration, the signal lines and shields of signal line layout 500 may be vertically spaced or horizontally spaced. For example, in some embodiments, the signal lines and shields of signal line layout 500 may be vertically spaced such that, for example, shield 502_A may be formed above signal line A", and signal line A" may be formed above shield 504_A and signal line B". In other words, each signal line and shield may be formed on a different horizontal plane. In other embodiments, the signal lines and shields of signal line layout 500 may be horizontally spaced such that the signal lines and shields are formed on the same horizontal plan. Other configurations are also contemplated, such as a configuration wherein a number of shields and/or signal lines are formed on one horizontal plane, and a number of shields and/or signal lines are formed on another horizontal plane.

As illustrated in FIG. 5, a shield 502 is positioned on one side of a signal line, and a partial shield 504 is positioned on another side of the signal line. More specifically, for example, shield 502_A is positioned on a first side of signal line A", and a partial shield 504_A is positioned on a second (e.g., opposite) side of signal line A". As illustrated, shield 502_A extends at least a length of adjacent signal line A", and partial shield 504_A extends less than a length of adjacent signal line A".

Further, in this example, partial shield 504_A is positioned between signal line A" and signal line B". However, in this embodiment, because partial shield 504_A only partially shields signal line A" from signal line B", and vice versa, at least a portion of signal line A" is unshielded from at least a portion of signal line B". Stated another way, a portion of signal line A" is positioned adjacent a portion of signal line B" and thus a portion of signal line A" is not isolated from a portion of signal line B" via a shield. Thus, in this embodiment, signal line A" and signal line B" are only partially shielded (e.g., 12.5% shielded) from one another.

As another example, shield 502_B is positioned on a first side of signal line C", and a partial shield 504_B is positioned on a second (e.g., opposite) side of signal line C". As illustrated, shield 502_B extends at least a length of adjacent signal line C", and partial shield 504_B extends less than a length of signal line C". In this example, partial shield 504_B is offset (e.g., horizontally in FIG. 5) from partial shield 504_A and is positioned between signal line C" and signal line D".

Further, as another example, shield 502_C is positioned on a first side of signal line E", and a partial shield 504_C is positioned on a second (e.g., opposite) side of signal line E". As illustrated, shield 502_C extends at least a length of adjacent signal line E", and partial shield 504_C extends less than a length of signal line E". In this example, partial shield 504_C is offset (e.g., horizontally in FIG. 5) from partial shield 504_B and is positioned between signal line E" and signal line F".

As yet another example, shield 502_D is positioned on a first side of signal line G", and a partial shield 504_D is positioned on a second (e.g., opposite) side of signal line G". As illustrated, shield 502_D extends at least a length of adjacent signal line G", and partial shield 504_D extends less than a length of signal line G". In this example, partial shield 504_D is offset (e.g., horizontally in FIG. 3) from partial shield 504_C and is positioned between signal line G" and signal line H".

For example, signal line layout 500 has a 56.25% shield rate. In other words, a first side of each signal line is fully shielded (i.e., 100% shielded), and a second side of each signal line is 12.5% shielded (i.e., 0.5*100%+0.5*12.5%=56.25% shield rate). Further, in the illustrated embodiment, signal line layout 500 includes sixteen (16) signal lines, nine (9) full shields, and eight (8) partial shields, wherein each partial shield is 12.5% of a full shield. Thus, in this example, signal line layout 500 may include an equivalent of ten (10) full shields (i.e., 9+8(0.125)=10).

As shown in FIGS. 3-5, a number of signal lines (i.e., signal lines B-G and J-O of FIG. 3) and a number of shields of each signal line layout (i.e., shields 302_B-302_D and shields 302_F-302_H of signal line layout 300 of FIG. 3) include a bend. As will be appreciated, these bends, although not necessary, may reduce a size of a signal line layout while allowing a partial shield to be positioned between signal lines. Further, although these bends are illustrated as 90-degree square bends, any suitable configuration that allows for a partial shield to be positioned between signal lines is within the scope of the present disclosure.

FIGS. 3-5 depict various configurations for various shield rates (i.e., 62.5%, 75%, and 56.25%), however the present disclosure is not limited to these specific configurations. Rather, any other suitable shield rate may be within the scope of the disclosure. For example, a size of one or more partial shields (e.g., one or more of shields 304 of FIG. 3, one or more of shields 404 of FIG. 4, and/or one or more of shields 504) may be adjusted for other shield rates (80%, 70%, 50%, 40%, or any shield rate). Further, in some embodiments, a size of one or more full shields (e.g., one or more of shields 302 of FIG. 3, one or more of shields 402 of FIG. 4, and/or one or more of shields 502) may be adjusted depending on a desired shield rate. In other words, one or more of shields 302/402/502 may be partial shields. In these embodiments, two sides of a signal line may be partially shielded. Moreover, although signal line layouts 300, 400, and 500 includes sixteen (16) signal lines, signal line layouts including any number of signal lines (e.g., 128 or 256) are within the scope of the present disclosure. According to various embodiments, a signal line layout may include N signal lines and N+1 shields.

Figure 6:
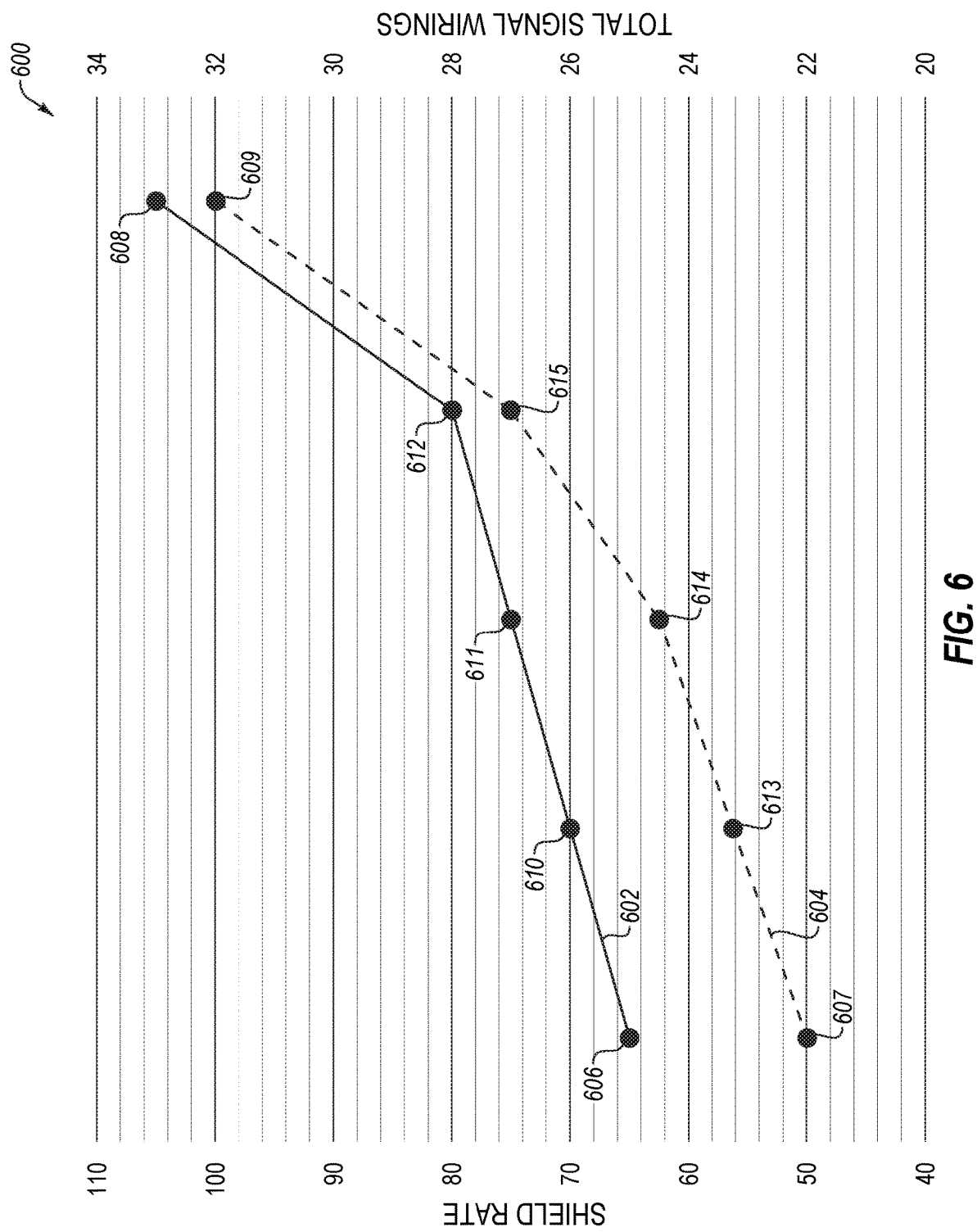
FIG. 6 includes a plot depicting example shield rates relative to example numbers of signal lines.

FIG. 6 includes a plot 600 depicting example shield rates relative to example numbers of signal lines. More specifically, line 602 represents a number of lines (i.e., signal lines and shield lines), and line 604 represents a shield rate. Thus, in one example, for 25 lines, a 50% shield rate may be achieved, as indicated by reference numerals 606 and 607. As another example, for 26 lines, a 56.5% shield rate may be achieved, as indicated by reference numerals 610 and 613. As yet another example, for 28 lines, a 75% shield rate may be achieved, as indicated by reference numerals 612 and 615. In contrast to conventional devices and methods that only allowed for shields rates identified by reference numerals 606-609, various embodiments of the present disclosure may allow for selecting various shield rates, such as shields rates identified by any of reference numerals 606-615.

Figure 7:
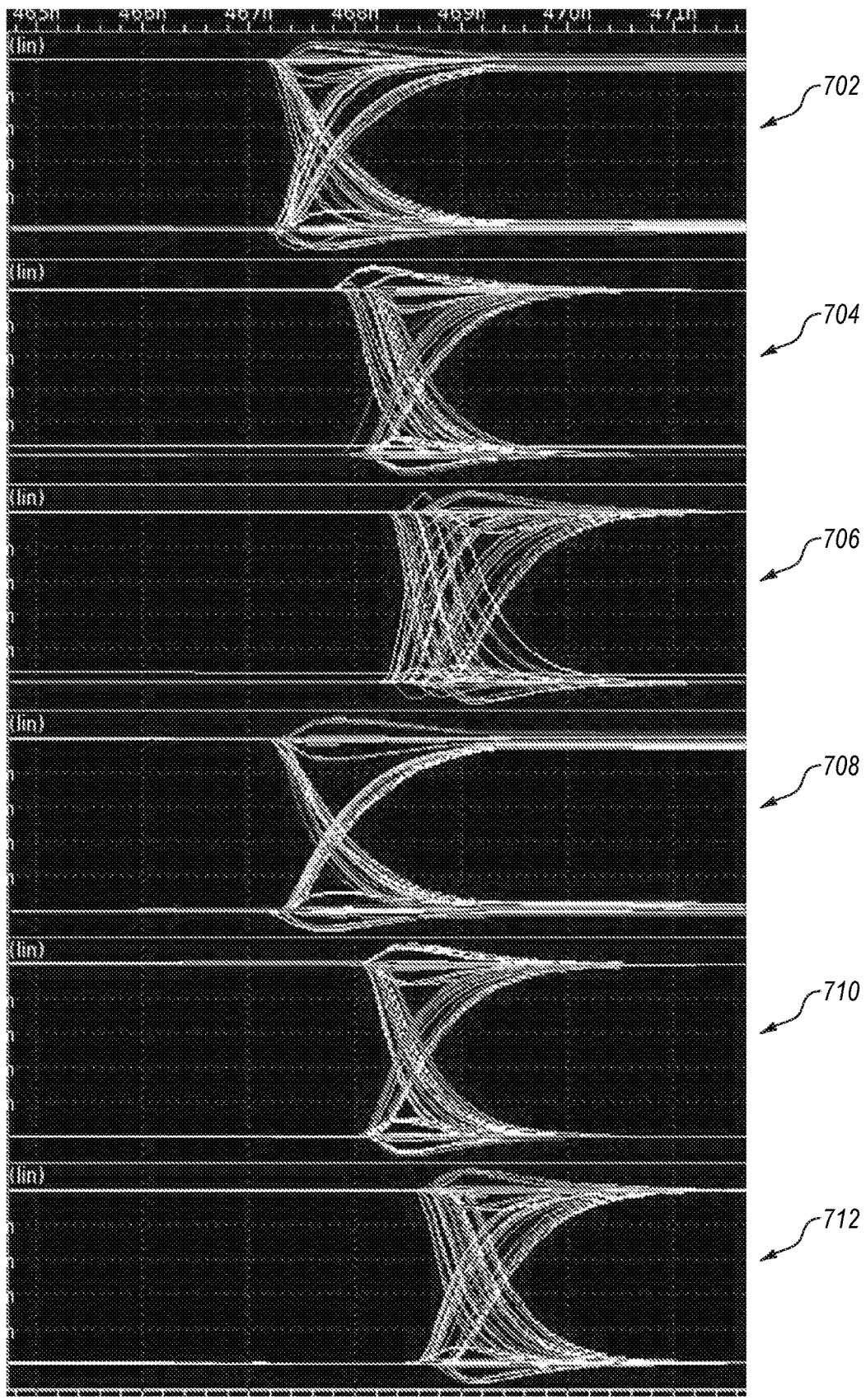
FIG. 7 depicts various waveforms associated with various shield rates.

FIG. 7 depicts signal waveforms 702, 704, and 706 associated with a 50% shield rate, and other waveforms 708, 710, and 712 are associated with a 62.5% shield rate. Waveforms 702 and 708 are associated with a first example configuration, Waveforms 704 and 710 are associated with a second example configuration, and waveforms 706 and 712 are associated with a third example configuration. As shown in FIG. 7, timing differences associated with a 62.5% shield rate (i.e., waveforms 708, 710, and 712) are suppressed relative to timing differences associated with a 50% shield rate (i.e., waveforms 702, 704, and 706) due to a greater shield effect. Signal noise associated with waveforms 708, 710, and 712 is less than signal noise associated with waveforms 702, 704, and 706. In this example, waveforms 702 and 708 are associated with an input of a first inverter of a signal line, waveforms 704 and 710 are associated with an output of the first inverter and an input of a second inverter of the signal line, and waveforms 706 and 712 are associated with an output of the second inverter of the signal line.

Figure 8:
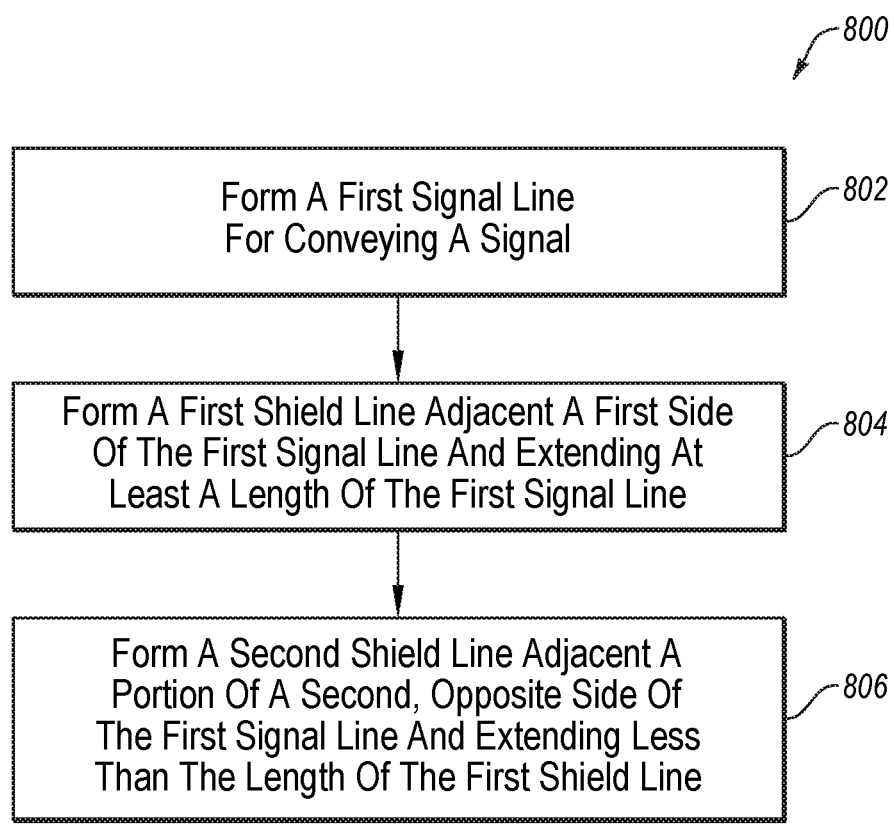
FIG. 8 is a flowchart of an example method of forming a signal line layout, in accordance with various embodiments of the present disclosure.

FIG. 8 is a flowchart of an example method 800 of forming a signal line layout of an integrated circuit (e.g., of a semiconductor device and/or a memory device), in accordance with various embodiments of the disclosure. Method 800 may be arranged in accordance with at least one embodiment described in the present disclosure. Although illustrated as discrete blocks, various blocks may be divided into additional blocks, combined into fewer blocks, or eliminated, depending on the desired implementation.

Method 800 may begin at block 802, wherein a first signal line for conveying a signal may be formed, and method 800 may proceed to block 804. For example, with reference to FIGS. 3, 4, and 5, signal line A/A'/A" may be formed (e.g., via any suitable semiconductor manufacturing process).

At block 804, a first shield line extending at least a length of the first signal line may be formed adjacent a first side of the first signal line, and method 800 may proceed to block 806. For example, with reference to FIGS. 3, 4, and 5, shield 302_A/402_A/502_A may be formed (e.g., via any suitable semiconductor manufacturing process).

At block 806, a second shield line extending less than the length of the first shield line may be formed adjacent a portion of a second, opposite side of the first signal line. For example, with reference to FIGS. 3, 4, and 5, shields 304_A/404_A/504_A may be formed (e.g., via any suitable semiconductor manufacturing process).

Modifications, additions, or omissions may be made to method 800 without departing from the scope of the present disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein a second signal line including a first side adjacent at least a portion of the second shield line may be formed. Further, a method may include one or more acts wherein a third shield line extending at least a length of the second signal line may be formed adjacent a second, opposite side of the second signal line.

A semiconductor device is also disclosed. According to various embodiments, the semiconductor device may include a memory device including one or more memory cell arrays, such as memory cell array 102 (see FIG. 1). The one or more memory cell arrays may include a number of memory cells.

Figure 9:
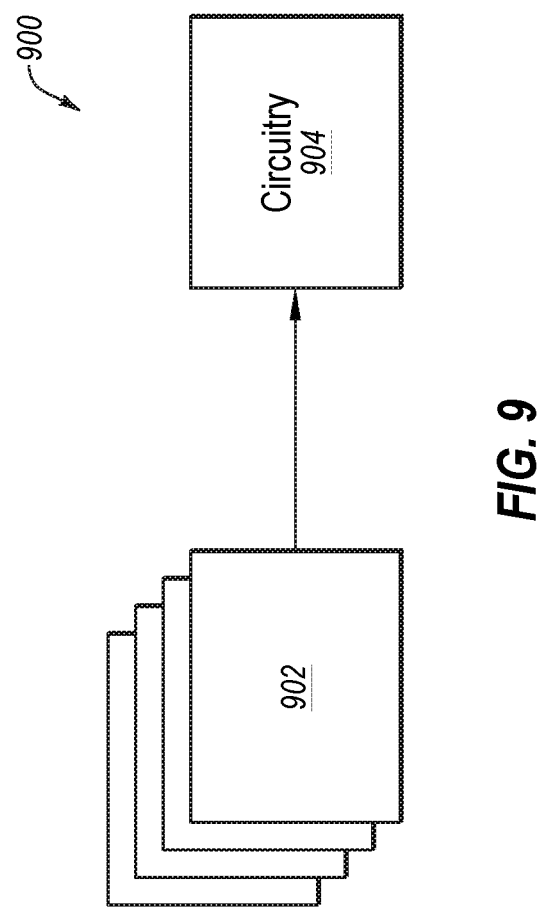
FIG. 9 is a simplified block diagram of an example semiconductor device, in accordance with various embodiments of the present disclosure.

FIG. 9 is a simplified block diagram of a semiconductor device 900 implemented according to one or more embodiments described herein. Semiconductor device 900 may include, for example, a memory device. In this example, semiconductor device 900 includes a memory array 902 and circuitry 904. Memory array 902, which may include a number of memory banks, may include a number of memory cells.

Circuitry 904 may be operatively coupled with memory array 902 so as to enable data to be read from or written to any or all memory cells within memory array 902. Circuitry 904 may include one or more signal line layouts arranged according to one or more embodiments disclosed herein. For example, in some embodiments, circuitry 904, which may include, for example, signal line layout 300 of FIG. 3, signal line layout 400 of FIG. 4, and/or signal line layout 500 of FIG. 5, may be used to read data from and/or write data to a memory array (e.g., memory cell array 102 of FIG. 1), in accordance with various embodiments disclosed herein.

A system is also disclosed. According to various embodiments, the system may include a semiconductor device, such as a memory device including a number of memory banks, wherein each memory bank includes an array of memory cells. Each memory cell may include an access transistor and a storage element operably coupled with the access transistor.

FIG. 10 is a simplified block diagram of an electronic system 1000 implemented according to one or more embodiments described herein. Electronic system 1000 includes at least one input device 1002, which may include, for example, a keyboard, a mouse, or a touch screen. Electronic system 1000 further includes at least one output device 1004, such as a monitor, a touch screen, or a speaker. Input device 1002 and output device 1004 are not necessarily separable from one another. Electronic system 1000 further includes a storage device 1006. Input device 1002, output device 1004, and storage device 1006 may be coupled to a processor 1008. Electronic system 1000 further includes a semiconductor device 1010 coupled to processor 1008. Semiconductor device 1010, which may include semiconductor device 900 of FIG. 9, may include a memory device including an array of memory cells. Electronic system 1000 may include, for example, a computing, processing, industrial, or consumer product. For example, without limitation, electronic system 1000 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include an integrated circuit including a signal line layout. The signal line layout may include a number of signal lines configured for conveying a number of signals. The signal line layout may further include a number of shield lines. Each signal line of the number of signal lines may be positioned between a first shield line and a second shield line of the number of shield lines. Further, the first shield line may extend a length of an adjacent signal line and the second shield line may extend less than a length of the adjacent signal line.

One or more other embodiments of the present disclosure include a method of forming a signal line layout of an integrated circuit. The method may include forming a first signal line for conveying a signal. Further, the method may include forming a first shield line adjacent a first side of the first signal line and extending at least a length of the first signal line. The method may also include forming a second shield line adjacent a portion of a second, opposite side of the first signal line and extending less than the length of the first shield line.

In accordance with another embodiment, method of forming a signal line layout of an integrated circuit may include forming a number of signal lines for conveying signals, respectively. The method may also include forming a number of shield lines such that each of the number of signal lines is partially positioned in a shielded region between a full shield and a partial shield of the number of shield lines, the shielded region being equal among the number of shield lines.

Additional embodiments of the present disclosure include an electronic system. The electronic system may include at least one input device, at least one output device, and at least one processor device operably coupled to the input device and the output device. The electronic system may also include at least one semiconductor device operably coupled to the at least one processor device and including circuitry. The circuitry may include a first signal line having a first length. The circuitry may further include a first shield positioned adjacent a first side of the first signal line and having a second length greater than or substantially equal to the first length of the first signal line. Further, the circuity may include a second shield positioned adjacent a second, opposite side of the first signal line and having a third length less than the second length of the first shield line.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. An integrated circuit, comprising:
   a signal line layout, comprising:
      a number of signal lines configured for conveying a number of signals; and
      a number of shield lines, wherein each signal line of the number of signal lines is positioned between a first shield line and a second shield line of the number of shield lines, the first shield line extending a length of an adjacent signal line and the second shield line extending less than a length of the adjacent signal line.

2. The integrated circuit of claim 1, wherein the number of signal lines includes a first signal line having a first length, wherein the first shield line is positioned adjacent a first side of the first signal line and includes a second length greater than or substantially equal to the first length of the first signal line, wherein the second shield line is positioned adjacent a second, opposite side of the first signal line and having a third length less than the second length.

3. The integrated circuit of claim 2, wherein a portion of the second, opposite side of the first signal line is positioned adjacent the second shield line and another portion of the second, opposite side of the first signal line is positioned adjacent a second signal line of the number of signal lines.

4. The integrated circuit of claim 2, wherein the number of shield lines includes at least one additional shield line having a length substantially equal to a length of the second shield line and horizontally offset from the second shield line.

5. The integrated circuit of claim 1, wherein the second shield line extends a length of approximately 25% of the length of the adjacent signal line.

6. The integrated circuit of claim 1, wherein the second shield line extends a length of approximately 50% of the length of the adjacent signal line.

7. The integrated circuit of claim 1, wherein the second shield line extends a length of approximately 12.5% of the length of the adjacent signal line.

8. The integrated circuit of claim 1, wherein each signal line of the number of signal lines is coupled to a memory array of a memory device.

9. The integrated circuit of claim 1, wherein the number of signal lines comprises N signal lines and the number of shield lines comprises N+1 shield lines.

10. A method of forming a signal line layout of an integrated circuit, comprising:
    forming a first signal line for conveying a signal;
    forming a first shield line adjacent a first side of the first signal line and extending at least a length of the first signal line;
    forming a second shield line adjacent a portion of a second, opposite side of the first signal line and extending less than the length of the first shield line;
    forming a second signal line including a first side adjacent at least a portion of the second shield line; and
    forming a third shield line adjacent a second, opposite side of the second signal line and extending at least a length of the second signal line.

11. The method of claim 10, wherein forming the second signal line comprises forming the second signal line including the first side adjacent at least a portion of the second, opposite side of the first signal line.

12. The method of claim 10, wherein forming the second shield line comprises forming the second shield line to extend a length of one of: approximately 12.5% of the length of the first signal line; approximately 25% of the length of the first signal line; and approximately 50% of the length of the first signal line.

13. The method of claim 10, further comprising:
    forming a third signal line including a first side adjacent at least a portion of the third shield line; and
    forming a fourth shield line adjacent a second, opposite side of the third signal line and extending less than a length of the third signal line.

14. The method of claim 13, wherein forming the fourth shield line comprises forming the fourth shield line horizontally offset from the second shield line.

15. An electronic system comprising:
    at least one input device;
    at least one output device;
    at least one processor device operably coupled to the input device and the output device; and
    at least one semiconductor device operably coupled to the at least one processor device and including circuitry, the circuitry comprising:
      a first signal line having a first length;
      a first shield line positioned adjacent a first side of the first signal line and having a second length greater than or substantially equal to the first length of the first signal line;
      a second shield line positioned adjacent a second side of the first signal line and having a third length less than the second length of the first shield line, the second side of the first signal line opposite the first side of the first signal line; and
      a second signal line, wherein a first portion of the second signal line is positioned adjacent the second shield line and a second portion of the second signal line is positioned adjacent the second, opposite side of the first signal line.

16. The electronic system of claim 15, wherein the circuitry further comprises a third shield line positioned adjacent the second signal line and having a fourth length greater than or substantially equal to a fifth length of the second signal line.

17. The electronic system of claim 15, wherein the at least one semiconductor device comprises a memory device including a memory array coupled to the circuitry.

18. The electronic system of claim 15, wherein the second shield line extends a length approximately equal to one of: 12.5% of the first length of the first signal line; 25% of the first length of the first signal line; and 50% of the first length of the first signal line.

19. A method of forming a signal line layout of an integrated circuit, comprising:
    forming a number of signal lines for conveying signals, respectively; and
    forming a number of shield lines such that each of the number of signal lines is partially positioned in a shielded region between a full shield and a partial shield of the number of shield lines, the shielded region being equal among the number of shield lines.

20. The method claim 19, wherein forming the number of shield lines such that each of the number of signal lines is partially positioned in the shielded region between a full shield and a partial shield comprises forming the number of shield lines such that each of the number of signal lines is partially positioned in the shielded region between a full shield and the partial shield being one of 25% of the full shield, 50% of the full shield, and 12.5% of the full shield.

21. The method of claim 19, wherein the forming the number of shield lines such that each of the number of signal lines is partially positioned in the shielded region comprises forming the number of shield lines such that each of the number of signal lines is partially positioned in the shielded region providing one of a 62.5% shield rate, a 75% shield rate, and a 56.25% shield rate.

* * * * *